United States Patent
Clement et al.

(10) Patent No.: US 7,299,433 B2
(45) Date of Patent: Nov. 20, 2007

(54) TIMING ANALYSIS APPARATUS, SYSTEMS, AND METHODS

(75) Inventors: Manuel S. Clement, Folsom, CA (US); Vivek Trivedi, Elk Grove, CA (US); Sadiq Mohiuddin, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 800 days.

(21) Appl. No.: 10/458,537

(22) Filed: Jun. 9, 2003

(65) Prior Publication Data

US 2004/0250224 A1    Dec. 9, 2004

(51) Int. Cl.
 *G06F 17/50* (2006.01)

(52) U.S. Cl. .......................................... 716/6

(58) Field of Classification Search ............... 716/4, 716/6
See application file for complete search history.

(56) References Cited

U.S. PATENT DOCUMENTS

| | | | |
|---|---|---|---|
| 6,014,510 A * | 1/2000 | Burks et al. ................. | 703/19 |
| 6,877,139 B2 * | 4/2005 | Daga ............................ | 716/1 |

* cited by examiner

*Primary Examiner*—Jack Chiang
*Assistant Examiner*—Brandon Bowers
(74) *Attorney, Agent, or Firm*—Schwegman, Lundberg & Woessner, P.A.

(57) ABSTRACT

An apparatus and a system, as well as a method and article, may operate to include receiving initial static timing environment data associated with a circuit at a graphical user interface, and generating a data file including a plural of all possible sources of a generated clock included in the circuit.

27 Claims, 4 Drawing Sheets

TIMING ANALYSIS APPARATUS, SYSTEMS, AND METHODS

TECHNICAL FIELD

Various embodiments described herein relate generally to apparatus, systems, and methods used to design and test circuitry, including timing analyses, such as static timing analysis (STA) techniques.

BACKGROUND INFORMATION

Some engineers consider the most difficult part of integrated circuit design to be the determination of timing relationships between individual circuit elements. As chip complexity increases, STA techniques are often used to verify designs. Some analysis tools, such as PrimeTime® STA tools ("PrimeTime" is a registered trademark of Synopsys, Inc.), can provide full-chip, gate-level static timing analyses in a semi-automated manner. However, the repetitive nature of various data entry tasks may result in an erroneous analysis result.

For example, entering all of the data comprising an initial static timing environment prior to running an automated analysis can be quite tedious. Multiple engineers working on the same project may not adhere to standardized guidelines. In addition, false path designations applied by engineers to certain inter-clock paths for one operational mode may turn out to be valid paths in another mode. Finally, it may be necessary to manually create multiple clock generation files to support the existence of multiple sources for individual generated clocks. Any errors introduced as a part of implementing these tasks can easily propagate to the final result. Thus, improved consistency in developing the initial static timing environment, as well as greater uniformity in defining false paths and sources of generated clocks may reduce the number of errors present in the final analysis result.

DETAILED DESCRIPTION

In the following detailed description of various embodiments, reference is made to the accompanying drawings that form a part hereof, and in which are shown by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. The following detailed description, therefore, is not to be taken in a limiting sense, and the scope of various embodiments is defined only by the appended claims, along with the full range of equivalents to which such claims are entitled.

At this time, some of the possible structures which may be used in various embodiments of apparatus and systems will be described. Shortly thereafter, some of the operational methods which may be implemented according to assorted embodiments will be discussed. Several of the terms used in this document are defined as follows:

Case Analysis: includes the specification of circuit states by constraining nodes, ports, pins, or nets to constant values, such as logical values of "0" or "1".

Case Analysis Statements: may include a set of case analysis constraints that force a design to operate in a particular mode.

Design Constraint File: may include a *.tcl format script file used to communicate design intent between tools, and provide clock and delay constraints. The design constraint file may also contain design rule constraints and timing exceptions (e.g., false paths, multi-cycle paths, disable timing, etc).

Initial Static Timing Environment Data: may include netlist, library, and design constraint files and/or data, but does not necessarily include all cases needed to put a block in valid operational modes, including all valid timing exceptions. The environment may be used as a starting point to enter such cases and exceptions, and may include one, some, or all possible relationships with respect to each internal clock and one, some, or all input clocks for one, some, or all modes of operation.

Mode of Operation: with respect to a circuit may result from constraining the values applied to a minimum set of control nodes so as to place a block in a particular state of valid operation. For example, a circuit that controls a traffic light may have a RED (Stop), GREEN (Go) and YELLOW (slow) modes of operation.

Node: with respect to a circuit, is a designated junction in the circuit where logic signal levels or timing behavior may be proactively manipulated, and/or reactively recorded.

Timing Analysis Script File: may be dynamically generated to describe the settings of control signals associated with clock generation logic based on propagated case analysis constraints associated with a particular design.

Figure 1:
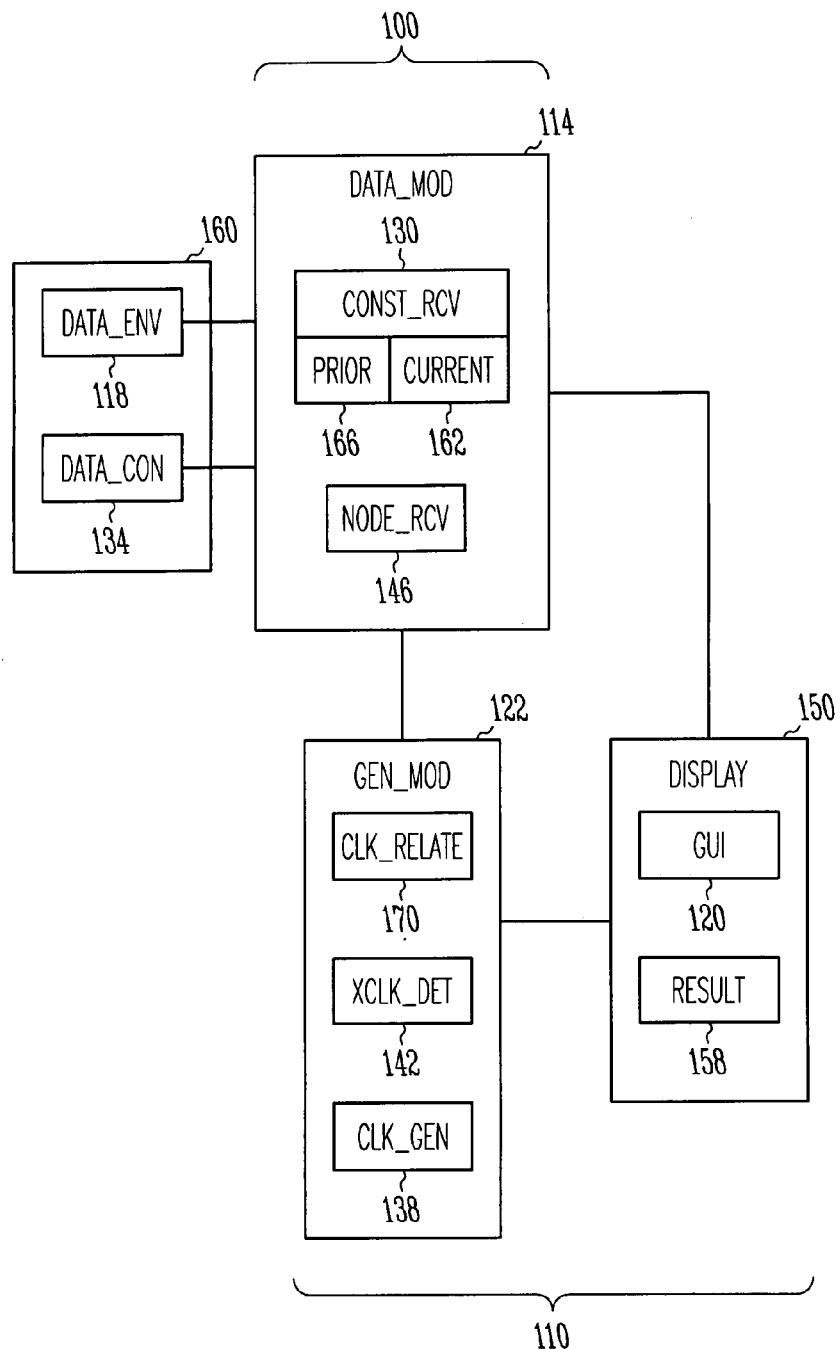
FIG. 1 is a block diagram of an apparatus and a system according to various embodiments.

FIG. 1 is a block diagram of an apparatus 100 and a system 110 according to various embodiments. The apparatus 100 may include a module 114 to receive initial static timing environment data 118 associated with a circuit. The data 118 may be received from a file, or perhaps at a graphical user interface 120 as entered by a user, for example. The apparatus 100 may also include a module 122 to generate one or more data files including a plurality sources of one or more generated clocks included in the circuit. In some embodiments, all possible sources of each and every generated clock included in the circuit will be recorded in a single data file.

For the purposes of this disclosure, a block is defined herein to mean a sub-design that has a gate-level netlist representation and that includes interface ports (inputs/outputs). The inputs can be driven to any particular set of values and a user should be able to observe the corresponding effects on the output ports of that block. Each block plays a particular function in the overall design. A block can also be a collection of other blocks interacting with each other (i.e., the highest level of a design can be considered a block).

The apparatus 100 may also include a module 130 to receive one or more block-specific constraints 134, such as one or more case analyses, one or more false path designations, one or more multi-cycle path designations, and one or more disable timing information specifications associated with one or more selected operational modes associated with the circuit. The apparatus 100 may further comprise a module 138 to create the generated clock for each one of a plurality of valid modes of operation associated with the circuit, as well as a module 142 to detect one or more cross-clock domain timing paths. In some embodiments, the apparatus 100 may include a module 146 to receive an identification of a minimum number of nodes for case analysis.

In some embodiments, a system 110 may include a display 150 to display a graphical user interface 120 (described above, and serving as a possible entry point for circuit data by the user), as well as one or more results 158 of a timing analysis associated with the circuit. The system 110 may also include a module 114 to receive the initial static timing environment data 118 associated with the circuit, and a module 122 to generate one or more data files, including a plurality of all possible sources of one or more generated clocks included in the associated circuit.

As is the case with the apparatus 100, the system 110 may include a module 130 to receive one or more block-specific constraints 134, a module 138 to create the generated clock for each one of a plurality of valid modes of operation associated with the circuit, and/or a module 142 to detect one or more cross-clock domain timing paths. In some embodiments, the system 110 may include a module 146 to receive an identification of a minimum number of nodes for case analysis. It is also the case that in some embodiments of the system 110, all possible sources of each and every generated clock included in the circuit may be recorded in a single data file. In some embodiments of the apparatus 100 and system 110, the initial static timing environment data 118 and/or the block-specific constraints 134 may be stored in a storage device 160 (e.g., a semiconductor memory, such as a flash memory, a disk drive, etc.) for retrieval by and/or transmission to the module 114.

The apparatus 100 and system 110 may comprise a module 162 receive a set of timing constraints included in the initial static timing environment. The apparatus 100 and system 110 may also comprise a module 166 to receive a set of constraints from a prior initial static timing environment, as well as a module 170 to determine a set of relationships between a set of all source clocks and a set of all generated clocks for the circuit. In some embodiments of the apparatus 100 and system 110, all relationships between the set of all source clocks and the set of all generated clocks for the circuit may be determined.

The apparatus 100, system 110, modules 114, 122, 130, 138, 142, 146, 162, 166, 170, data 118, graphical user interface 120, block-specific constraints 134, display 150, results 158, and storage device 160 may all be characterized as "modules" herein. Such modules may include hardware circuitry, and/or one or more processors and/or memory circuits, software program modules, including object and collections of objects, and/or firmware, and combinations thereof, as desired by the architect of the apparatus 100 and the system 110, and as appropriate for particular implementations of various embodiments.

It should also be understood that the apparatus and systems of various embodiments can be used in applications other than for computers, and other than for systems that include displays and graphical user interfaces, and thus, various embodiments are not to be so limited. The illustrations of an apparatus 100 and a system 110 are intended to provide a general understanding of the structure of various embodiments, and they are not intended to serve as a complete description of all the elements and features of apparatus and systems that might make use of the structures described herein.

Applications which may include the novel apparatus and systems of various embodiments include electronic circuitry used in high-speed computers, communication and signal processing circuitry, modems, processor modules, embedded processors, and application-specific modules, including multilayer, multi-chip modules. Such apparatus and systems may further be included as sub-components within a variety of electronic systems, such as televisions, cellular telephones, personal computers, workstations, radios, video players, vehicles, and others.

Figure 2:
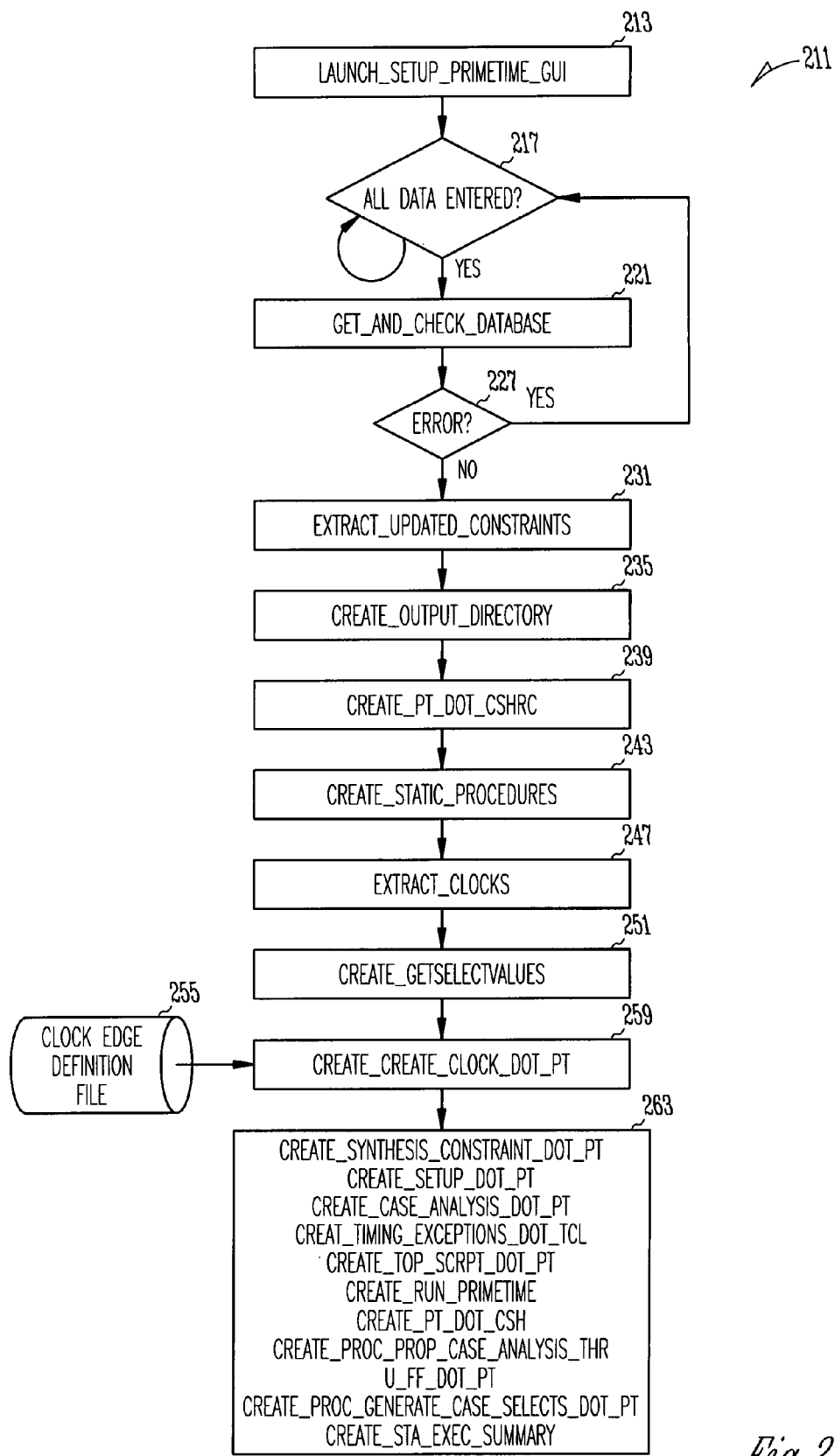
FIGS. 2 and 3 are flow charts illustrating several methods, according to various embodiments.
Figure 3:
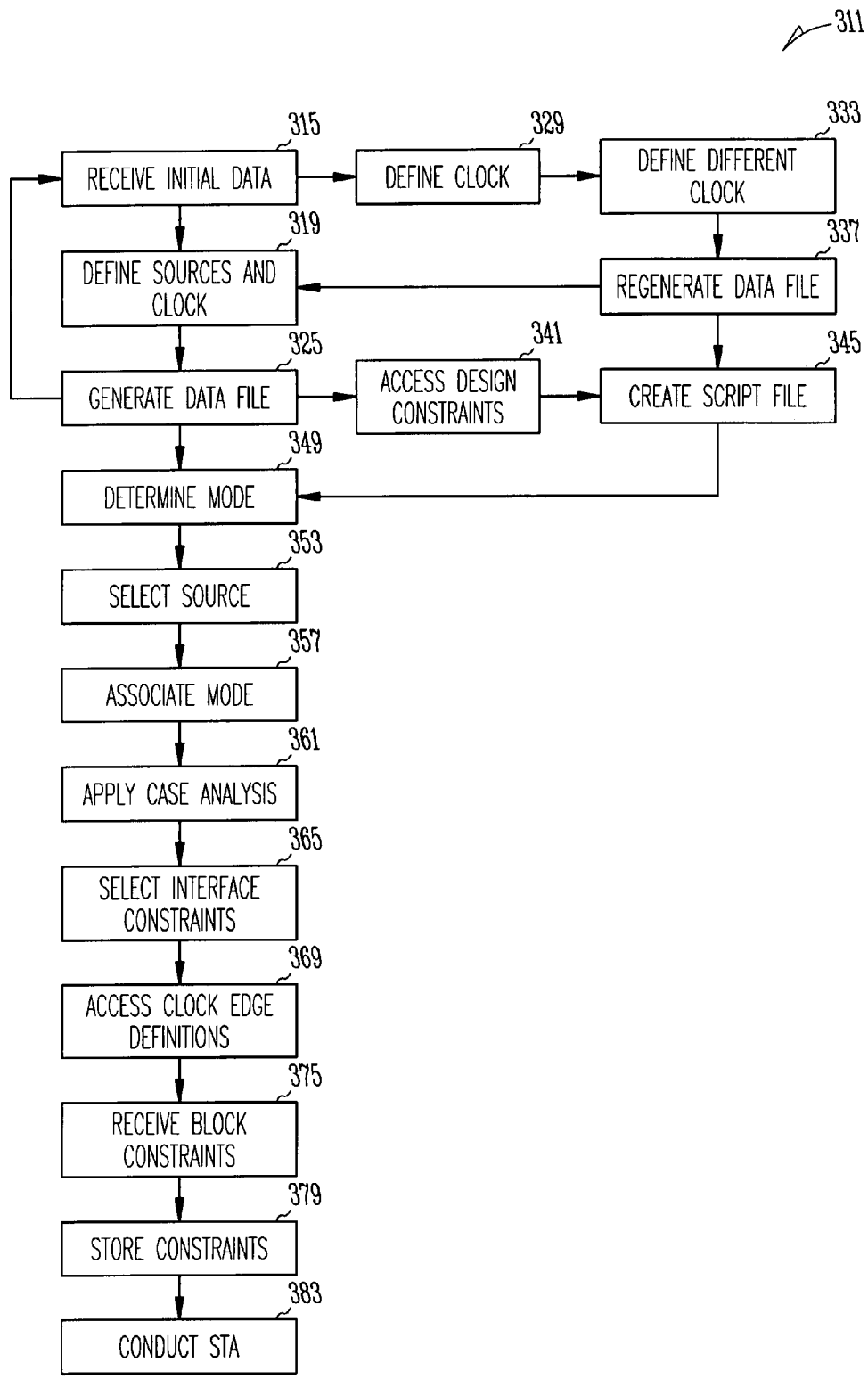

Many different embodiments may be realized. FIGS. 2 and 3 are flow charts illustrating several methods, according to various embodiments. The method 211 shown in FIG. 2 may begin with launching a GUI interface at box 213, for example. Thereafter, a user may enter design information, which may include initial static timing environment data, via the GUI at box 217. The information may also be retrieved from a storage device. Alternatively, or in addition, many design-specific fields may be filled in with default values that may or may not be overridden by each designer (e.g., this choice can be made on a project by project basis). This may allow designers to focus on maintaining consistency between different blocks in the circuit design, with less concern about the mechanics of data entry.

After all information has been entered at box 217, and checked against a database for errors in boxes 221 and 227, the method 211 may continue with extracting updated design constraints at box 231 and creating an output directory structure at box 235. The output directory structure may include, for example directories and/or files, such as inputs, scripts, reports, logs, and outputs.

Inputs may include files such as netlists, Synopsysg® Design Constraint (SDC) files, and parasitic files that other programs (e.g., Primetime® software) may use to perform a static timing analysis. Scripts include those scripts and procedures which may be used to run a timing analysis in an automated environment. Reports include timing reports for each valid mode of operation, such as violating paths, violating design rule checks, etc. Logs may include log files for each mode and operating condition associated with the analysis of a block. Outputs include files that may be used by other tools and/or flows, such as ILM (Interface Logic Module) netlists and parasitics (for full chip timing), Standard Delay Format (SDF) files for post-layout gate level simulation, and constraint files for each particular mode of operation.

An algorithm may then be implemented to find all clocks in the circuit design and determine the timing relationships between them (e.g., one or more PrimeTime® STA tools may be used to apply such an algorithm) at box 239. Static procedures may be created at box 243, and path information for one or more (or all) interrelated clocks may be extracted at box 247, as may various input/output constraints at box 251. The extracted results may then be used to determine one or more STA environments associated with one or more circuits.

Clock edge definitions may be entered or read from storage during the clock generation algorithm at box 255. The definitions may be in the form of macros and/or dividers, and this information may then be used to create the final clock generation file associated with one or more STA environments at box 259. After finding all of the clocks in the design and determining their inter-relationships, the scripts and procedures that form the STA environment can be generated at box 263. Designers may then enter block-specific constraints, including case analysis, false path, multi-cycle paths, and disable timing information for each valid operational mode based on design specifications for the circuit design.

The method 211 may also be invoked to read in the generated constraints from a previous executions so as to create new generated clock files. This may reduce the amount of re-work needed to analyze revised circuit netlists.

FIG. 3 illustrates other embodiments. A method 311 may begin with receiving initial static timing environment data associated with a circuit at box 315. The data may be received via many different mechanisms, such as at a GUI, or by retrieving the data from a storage, etc. The method 311 may include defining a plurality of all possible sources for one or more generated clocks, as well as the generated clocks themselves at box 319. The method 311 may continue with generating one or more data files that contain the plurality of all possible sources of one or more generated clocks included in the circuit at box 325. In some embodiments, the plurality of all possible sources of one or more generated clocks included in the circuit can be included in a single data file.

The initial static timing environment data may be selected so as to include many items, such as any one or more of the following: a design software version, a verification software version, a library type, an analysis type, a project designator, a netlist format, a netlist file path, a netlist stage, a link library, a database location, a customization option, and/or a design constraint selection. The design constraint selection may in turn include (but is not limited to) any one or more of the following: a clock constraint file, a general constraints file, a persistent constraints file, a parasitic constraints file, an operating conditions constraints file, an extraction file, and/or an exceptions file.

Receiving the initial static timing environment data associated with the circuit at box 315 may include defining one or more input clocks to the circuit at box 329, which may further comprise defining one or more different input clocks to the circuit at box 333, and regenerating the data file(s) so as to include a different plurality of all possible sources of one or more of the generated clocks included in the circuit at box 337.

Generating the data file that includes the plurality of all possible sources of the generated clock included in the circuit at box 325 may further include accessing a design constraint file (e.g., an SDC file) associated with a netlist file for the circuit at box 341, as well as creating a script file as an input to a timing analysis program (e.g., a timing analysis script file) at box 345.

The method 311 may include determining a selected mode of operation for the circuit at block at box 349, and selecting a single source from the plurality of all possible sources as a true source of the generated clock associated with the selected mode of operation for the circuit at box 353. The method 311 may also include associating the selected mode of operation with a set of case analysis statements at box 357, and applying the set of case analysis statements to, for example, an input port of a block, or an output pin of an internal register at box 361. In addition, the method 311 may include selecting a set of interface constraints from the design constraint file for application to block timing at box 365.

The method 311 may further include accessing a clock edge definition file at box 369, and receiving a block-specific constraint at box 375. The block-specific constraint may include any one or more of the following: a case analysis, a false path, a multi-cycle path, and/or disable timing information associated with one or more selected operational modes.

The method 311 may also be adapted to include repetitively receiving data and generating data files for a group of blocks that make up a larger circuit, such as an integrated circuit chip, including a chip that has a microprocessor, a digital signal processor, and/or an analog-to-digital converter, for example. Thus, the method 311 may include repeating receiving the initial static timing environment data at box 315 and generating the data file for a number of blocks included in a chip at box 325, wherein at least one of the number of blocks is associated with a set of constraints. The method 311 may then continue with storing the set of constraints for use in conducting a STA of the chip at box 379, and then conducting a STA of the chip using the set of constraints at box 383.

It should be noted that the methods described herein do not have to be executed in the order described, or in any particular order. Moreover, various activities described with respect to the methods identified herein can be executed in serial or parallel fashion. Information, including parameters, commands, operands, and other data, can be sent and received in the form of one or more carrier waves.

Upon reading and comprehending the content of this disclosure, one of ordinary skill in the art will understand the manner in which a software program can be launched from a computer readable medium in a computer-based system to execute the functions defined in the software program. One of ordinary skill in the art will further understand the various programming languages that may be employed to create one or more software programs designed to implement and perform the methods disclosed herein. The programs may be structured in an object-orientated format using an object-oriented language such as Java, Smalltalk, or C++. Alternatively, the programs can be structured in a procedure-orientated format using a procedural language, such as COBOL or C. The software components may communicate using any of a number of mechanisms well-known to those skilled in the art, such as application program interfaces or interprocess communication techniques, including remote procedure calls. The teachings of various embodiments of the present invention are not limited to any particular programming language or environment, including Hypertext Markup Language (HTML) and Extensible Markup Language (XML).

Figure 4:
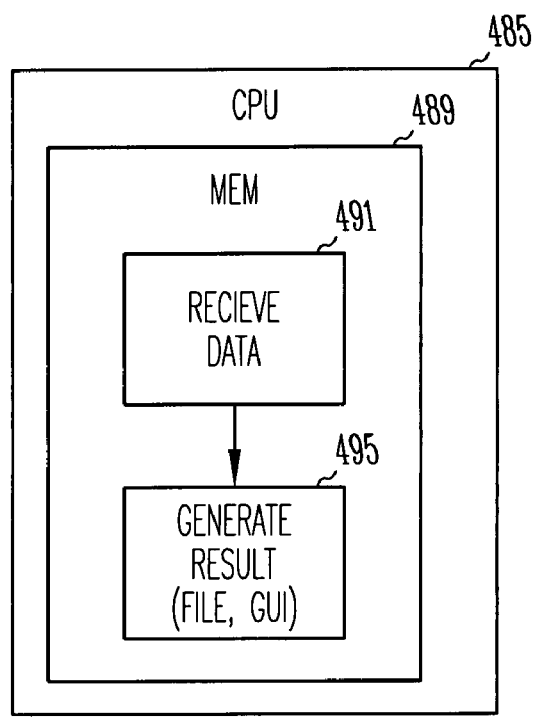
FIG. 4 is a block diagram of an article including a machine-accessible medium according to various embodiments.

FIG. 4 is a block diagram of an article including a machine-accessible medium according to various embodiments. Thus, it can now be seen that another embodiment may include an article 485 such as a computer, a memory system, a magnetic or optical disk, some other storage device, and/or any type of electronic device or system, comprising a machine-accessible medium such as a memory 489 (e.g., a memory including an electrical, optical, or electromagnetic conductor) having associated data 491, 495 (e.g., computer program instructions), which when accessed, results in a machine performing such actions as receiving initial static timing environment data associated with a circuit (e.g., from a storage, or at a GUI, etc.), and generating one or more data files including a plurality of all possible sources of one or more generated clocks included in the circuit. Other actions may include any of those noted in the methods previously described, for example, accessing a clock edge definition file, receiving a block-specific constraint including at least one of a case analysis, a false path, a multi-cycle path, and disable timing information associated with a selected operational mode, and/or repeating receiving the initial static timing environment data and generating a data file for a number of blocks included in a chip, wherein at least one of the number of blocks is associated with a set of constraints, as well as storing the set of constraints for use in conducting a STA of the chip. As noted above, generating the data file(s) including the plurality of all possible sources of the generated clock included in the circuit may include creating a script file as an input to a timing analysis program.

Improved consistency in developing the initial static timing environment, as well as greater uniformity in defining false paths and sources of generated clocks may result from implementing the apparatus, systems, and methods disclosed herein. The number of errors present various timing analyses may thus be reduced.

Although specific embodiments have been illustrated and described herein, it should be appreciated that any arrangement calculated to achieve the same purpose may be substituted for the specific embodiments shown. This disclosure is intended to cover any and all adaptations or variations of various embodiments of the invention. It is to be understood that the above description has been made in an illustrative fashion, and not a restrictive one. Combinations of the above embodiments, and other embodiments not specifically described herein, will be apparent to those of skill in the art upon reviewing the above description.

It is emphasized that the Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

What is claimed is:

1. A method, comprising:
    receiving initial static timing environment data associated with a circuit; and
    generating a data file including a plurality of all possible sources of a generated clock included in the circuit.

2. The method of claim 1, further comprising:
    determining a selected mode of operation for the circuit; and
    selecting a single source from the plurality of all possible sources as a true source of the generated clock associated with the selected mode of operation for the circuit.

3. The method of claim 2, further comprising:
    associating the selected mode of operation with a set of case analysis statements.

4. The method of claim 3, further comprising:
    applying the set of case analysis statements to an input port of a block.

5. The method of claim 1, further comprising:
    defining the plurality of all possible sources and the generated clock.

6. The method of claim 1, wherein receiving the initial static timing environment data associated with the circuit includes defining an input clock to the circuit, further comprising:
    defining a different input clock to the circuit; and
    regenerating the data file including a different plurality of all possible sources of the generated clock included in the circuit.

7. The method of claim 1, wherein generating the data file including the plurality of all possible sources of the generated clock included in the circuit further includes:
    accessing a design constraint file associated with a netlist file for the circuit.

8. The method of claim 7, further comprising:
    selecting a set of interface constraints from the design constraint file for application to block timing.

9. The method of claim 1, wherein the initial static timing environment data is selected from at least one of a design software version, a verification software version, a library type, an analysis type, a project designator, a netlist format, a netlist file path, a netlist stage, a link library, a database location, a customization option, and a design constraint selection.

10. The method of claim 9, wherein the design constraint selection includes at least one of a clock constraint file, a general constraints file, a persistent constraints file, a parasitic constraints file, an operating conditions constraints file, an extraction file, and an exceptions file.

11. The method of claim 1, further comprising:
    creating a timing analysis script file.

12. The method of claim 1, further comprising:
    repeating receiving the initial static timing environment data and generating the data file for a number of blocks included in a chip, wherein at least one of the number of blocks is associated with a set of constraints; and
    conducting a static timing analysis of the chip using the set of constraints.

13. An article comprising a machine-accessible medium having associated data, wherein the data, when accessed, results in a machine performing:
    receiving initial static timing environment data associated with a circuit; and
    generating a data file including a plurality of all possible sources of a generated clock included in the circuit.

14. The article of claim 13, wherein the data, when accessed, results in the machine performing:
    accessing a clock edge definition file.

15. The article of claim 13, wherein generating the data file including the plurality of all possible sources of the generated clock included in the circuit further comprises:
    creating a script file as an input to a timing analysis program.

16. The article of claim 13, wherein the data, when accessed, results in the machine performing:
    receiving a block-specific constraint including at least one of a case analysis, a false path, a multi-cycle path, and a disable timing information associated with a selected operational mode.

17. The article of claim 13, wherein the data, when accessed, results in the machine performing:
    repeating receiving the initial static timing environment data and generating the data file for a number of blocks included in a chip, wherein at least one of the number of blocks is associated with a set of constraints; and
    storing the set of constraints for use in conducting a static timing analysis of the chip.

18. An apparatus, comprising:
a module to receive initial static timing environment data associated with a circuit; and
a module to generate a data file including a plurality of all possible sources of a generated clock included in the circuit.

19. The apparatus of claim 18, further comprising:
a module to receive a block-specific constraint to be transmitted to the module to receive initial static timing environment data.

20. The apparatus of claim 18, wherein the block-specific constraint includes at least one of a case analysis, a false path, a multi-cycle path, and a disable timing information associated with a selected operational mode.

21. The apparatus of claim 18, further comprising:
a module to create the generated clock for each one of a plurality of valid modes of operation.

22. The apparatus of claim 18, further comprising:
a module to detect a cross-clock domain timing path.

23. The apparatus of claim 18, further comprising:
a module to receive an identification of a minimum number of nodes for case analysis.

24. A system, comprising:
a module to receive initial static timing environment data associated with a circuit at a graphical user interface;
a module to generate a data file including a plurality of all possible sources of a generated clock included in the circuit; and
a display to display the graphical user interface and a result of a timing analysis associated with the circuit.

25. The system of claim 24, further comprising:
a module to receive a set of timing constraints included in the initial static timing environment.

26. The system of claim 24, further comprising:
a module to receive a set of constraints from a prior initial static timing environment.

27. The system of claim 24, further comprising:
a module to determine a set of all relationships between a set of all source clocks and a set of all generated clocks for the circuit.

* * * * *